(12) United States Patent
Huotari et al.

(10) Patent No.: US 8,545,936 B2
(45) Date of Patent: Oct. 1, 2013

(54) METHODS FOR FORMING CARBON NANOTUBES

(75) Inventors: Hannu A. Huotari, Espoo (FI); Suvi P. Haukka, Helsinki (FI)

(73) Assignee: ASM International N.V. (NL)

( * ) Notice: Subject to any disclaimer, the term of this patent is extended or adjusted under 35 U.S.C. 154(b) by 903 days.

(21) Appl. No.: 12/058,565

(22) Filed: Mar. 28, 2008

(65) Prior Publication Data

US 2009/0246367 A1    Oct. 1, 2009

(51) Int. Cl.
*B05D 7/00*    (2006.01)

(52) U.S. Cl.
USPC ........................................ 427/215; 427/249.1

(58) Field of Classification Search
USPC .............. 427/301, 314, 250, 249.1; 117/84
See application file for complete search history.

(56) References Cited

U.S. PATENT DOCUMENTS

| | | | |
|---|---|---|---|
| 3,405,801 A | 10/1968 | Zwiacher et al. | |
| 4,058,430 A | 11/1977 | Suntola et al. | |
| 4,477,296 A | 10/1984 | Nair | |
| 5,372,962 A | 12/1994 | Hirota et al. | |
| 5,382,333 A | 1/1995 | Ando et al. | |
| 5,453,494 A | 9/1995 | Kirlin et al. | |
| 5,626,650 A * | 5/1997 | Rodriguez et al. | 95/116 |
| 5,711,811 A | 1/1998 | Suntola et al. | |
| 5,731,634 A | 3/1998 | Matsuo et al. | |
| 5,865,365 A | 2/1999 | Nishikawa et al. | |
| 5,916,365 A | 6/1999 | Sherman | |
| 5,939,334 A | 8/1999 | Nguyen et al. | |
| 6,006,763 A | 12/1999 | Mori et al. | |
| 6,033,584 A | 3/2000 | Ngo et al. | |
| 6,066,892 A | 5/2000 | Ding et al. | |
| 6,090,666 A | 7/2000 | Ueda et al. | |
| 6,124,189 A | 9/2000 | Watanabe et al. | |
| 6,130,123 A | 10/2000 | Liang et al. | |
| 6,303,500 B1 | 10/2001 | Jiang et al. | |

(Continued)

FOREIGN PATENT DOCUMENTS

| | | |
|---|---|---|
| DE | 41 08 73 | 8/1923 |
| EP | 0469470 A1 | 2/1992 |

(Continued)

OTHER PUBLICATIONS

Han, Jong Hun, et al., "Low Temperature Synthesis of Carbon Nanotubes by Thermal Chemical Vapor Deposition Using Co-Catalyst". Journal of the Korean Physical Society, vol. 39, Dec. 2001, pp. S116-S119.*

(Continued)

*Primary Examiner* — Bret Chen
(74) *Attorney, Agent, or Firm* — Knobbe, Martens, Olson & Bear, LLP (57) ABSTRACT

Methods of forming a roughened metal surface on a substrate for nucleating carbon nanotube growth, and subsequently growing carbon nanotubes are provided. In preferred embodiments roughened surfaces are formed by selectively depositing metal or metal oxide on a substrate surface to form discrete, three-dimensional islands. Selective deposition may be obtained, for example, by modifying process conditions to cause metal agglomeration or by treating the substrate surface to provide a limited number of discontinuous reactive sites. The roughened metal surface may then be used as nucleation points for initiating carbon nanotube growth. The carbon nanotubes are grown in the same process chamber (in-situ) as the formation of the three dimensional metal islands without exposing the substrate to air.

35 Claims, 6 Drawing Sheets

(56) References Cited

U.S. PATENT DOCUMENTS

| | | | |
|---|---|---|---|
| 6,323,131 B1 | 11/2001 | Obeng et al. | |
| 6,342,277 B1 | 1/2002 | Sherman | |
| 6,346,151 B1 | 2/2002 | Jiang et al. | |
| 6,433,432 B2 | 8/2002 | Shimizu | |
| 6,444,868 B1 | 9/2002 | Vaughn et al. | |
| 6,482,740 B2 | 11/2002 | Soininen et al. | |
| 6,780,704 B1 | 8/2004 | Raaijmakers et al. | |
| 6,824,816 B2 | 11/2004 | Aaltonen | |
| 6,852,635 B2 | 2/2005 | Satta et al. | |
| 6,913,789 B2* | 7/2005 | Smalley et al. | 427/249.1 |
| 6,921,712 B2 | 7/2005 | Soininen et al. | |
| 7,105,054 B2 | 9/2006 | Lindfors | |
| 7,108,747 B1 | 9/2006 | Leskela et al. | |
| 7,118,779 B2 | 10/2006 | Verghese et al. | |
| 7,438,949 B2 | 10/2008 | Weidman | |
| 7,491,634 B2* | 2/2009 | Huotari et al. | 438/592 |
| 7,923,382 B2* | 4/2011 | Huotari et al. | 438/785 |
| 2001/0003064 A1 | 6/2001 | Ohto | |
| 2001/0018266 A1 | 8/2001 | Jiang et al. | |
| 2001/0052318 A1 | 12/2001 | Jiang et al. | |
| 2002/0013487 A1 | 1/2002 | Norman et al. | |
| 2002/0027286 A1 | 3/2002 | Sundararajan et al. | |
| 2003/0165615 A1 | 9/2003 | Aaltonen et al. | |
| 2004/0005753 A1 | 1/2004 | Kostamo et al. | |
| 2004/0214354 A1 | 10/2004 | Marsh et al. | |
| 2004/0256662 A1 | 12/2004 | Black et al. | |
| 2005/0048794 A1 | 3/2005 | Brask et al. | |
| 2005/0089632 A1 | 4/2005 | Vehkamaki et al. | |
| 2005/0092247 A1 | 5/2005 | Schmidt et al. | |
| 2006/0046384 A1 | 3/2006 | Joo et al. | |
| 2006/0121733 A1 | 6/2006 | Kilpela et al. | |
| 2006/0240189 A1* | 10/2006 | Ger et al. | 427/249.1 |
| 2007/0014919 A1 | 1/2007 | Hamalainen et al. | |
| 2007/0026654 A1 | 2/2007 | Huotari et al. | |
| 2007/0036892 A1* | 2/2007 | Haukka et al. | 427/248.1 |
| 2007/0148347 A1 | 6/2007 | Hatanpaa et al. | |
| 2007/0196575 A1* | 8/2007 | Dominguez et al. | 427/249.1 |
| 2007/0254488 A1* | 11/2007 | Huotari et al. | 438/720 |
| 2010/0004372 A1* | 1/2010 | Goto et al. | 524/430 |
| 2010/0207053 A1* | 8/2010 | Ryu et al. | 252/71 |

FOREIGN PATENT DOCUMENTS

| | | |
|---|---|---|
| EP | 0511264 B2 | 8/1995 |
| EP | 0880168 A2 | 11/1998 |
| GB | 2 340 508 A | 2/2000 |
| WO | WO 93/10652 | 5/1993 |
| WO | WO 00/03420 | 1/2000 |

OTHER PUBLICATIONS

Nagatsu, Masaaki, et al., "Narrow multi-walled carbon nanotubes produced by chemical vapor deposition using graphene layer encapsulated catalytic metal particles." Carbon 44 (2006) pp. 3336-3341.*

Kuznetsov, Vladimir L., et al., "Thermodynamic analysis of nucleation of carbon deposits on metal particles and its implications for the growth of carbon nanotubes". Physical Review B, vol. 64, 235401, pp. 1-7.*

Tuyen, Le Thi Trong, et al., "Hydrogen termination for the growth of carbon nanotubes on silicon". Chemical Physics Letters 415 (2005) pp. 333-336.*

Han, Jae-Hee, et al., "A Mechanochemical Model of Growth Termination in Vertical Carbon Nanotube Forests". ACSNANO, vol. 2 No. 1 Jan. 22, 2008, pp. 53-60.*

Kanzow, Henning, et al., "Formation mechanism of single-wall carbon nanotubes on liquid-metal particles". Physical Review B, vol. 60, No. 15, Oct. 15, 1999-I, 11180-11186.*

Kuznetsov, Vladimir L., et al., "Thermodynamic analysis of nucleation of carbon deposits on metal particles and its implications for the growth of carbon nanotubes". Physical Review B, vol. 64, 235401, 2001, pp. 1-7.*

Rodriguez-Manzo, Julio A., et al., "Growth of Single-Walled Carbon Nanotubes from Sharp Metal Tips". Small 2009, 5, No. 23, 2710-2715.*

Aaltonen et al., "Atomic Layer Deposition of Noble Metal Thin Films," dissertation presented at the University of Helsinki, Helsinki, Finland, 2005.

Aaltonen et al., "Atomic Layer Deposition of Platinum Thin Films," *Chem. Mater.* 15:1924-1928 (2003).

Baliga, J., "New Designs and Materials Tackle 1 Gb Memory Challenge, " Semiconductor International, World Wide Web address: semiconductor.net, Nov. 2000.

Basceri, C., "Eletrial Dielectric Properties of (Ba,Sr) TiO3 Thin Film Capacitors for Ultra-High Density Dynamic Random Access Memories", Thesis, 1997.

Haukka et al., "Chemisorption of Chromium Acetylacetonate on Porous High Surface Area Silica," *Appl. Surface Science* 75:220-227 (1994).

Haukka and Root, "The Reaction of Hexamethyldisilazane and Subsequent Oxidation of Trimethylsilyl Groups on Silica Studied by Solid-State NMR and FTIR," *J. Phys. Chem.* 98:1695-1703 (1994).

Kwon et al., "Ruthenium Bottom Electrode Prepared by Electroplating for a High Density DRAM Capacitor," J. Electrochem. Soc. 151(2): C127-C132 (2004).

Liu et al., "Metal Nanocrystal Memories—Part I: Device Design and Fabrication," *IEEE Transactions on Electron Devices* 49(9): 1606-1613 (2002).

Liu et al., "Metal Nanocrystal Memories—Part II: Electrical Characteristics," *IEEE Transactions on Electron Devices* 49(9): 1614-1622 (2002).

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

SOI Technology: IBM's Next Advance in Chip Design, 1998.

Ren et al. "Low temperature carbon nanotube growth on Ni-CaF$_2$ coated sodalime glass substrate using thermal CVD method" Vacuum Electron Sources Conference (2004), pg. 159-162.

Nasibulin et al. "An essential role of CO$_2$ and H$_2$O during single-walled CNT synthesis from carbon monoxide" Chemical Physics letters 417 (2006) 179-184.

* cited by examiner

METHODS FOR FORMING CARBON NANOTUBES

CROSS-REFERENCE TO RELATED APPLICATIONS

This application is related to U.S. patent application Ser. No. 11/414,510, filed Apr. 28, 2006, by Huotari et al., which is incorporated by reference herein.

BACKGROUND OF THE INVENTION

1. Field of the Invention

The invention generally relates to growing carbon nanotubes on roughened metal surfaces. The carbon nanotubes can be used, for example, in integrated circuits. More particularly, methods for growing carbon nanotubes from roughened thin films and particles are provided, along with structures incorporating such films and particles.

2. Description of the Related Art

Carbon nanotubes (CNTs) are members of the fullerene structural family, which also includes buckyballs. Whereas buckyballs are spherical in shape, a nanotube is cylindrical, with at least one end typically capped with a hemisphere of the buckyball structure. Their name is derived from their size, since the diameter of a nanotube is in the order of a few nanometers, while they can be up to several millimeters in length. There are two main types of nanotubes: single-walled nanotubes (SWNTs) and multi-walled nanotubes (MWNTs).

CNTs have novel properties that make them potentially useful in many applications in areas such as nanotechnology, electronics, optics and other fields of materials science. They exhibit extraordinary strength and unique electrical properties, and are efficient conductors of heat.

SUMMARY OF THE INVENTION

In one aspect of the invention, methods for forming a roughened surface on a substrate and growing carbon nanotubes (CNT) from the roughened surface are provided. In preferred embodiments the methods comprise forming a discontinuous surface termination on the substrate, forming islands of metal or metal oxide on the surface and then growing carbon nanotubes from the islands, in situ, that is with the substrate not exposed to air or an external environment between forming islands and growing carbon nanotubes.

Atomic layer deposition (ALD) processes are preferably used to deposit metal particles at reactive sites on the substrate surface using alternating and sequential pulses of a metal source chemical and a reducing agent species. Carbon nanotubes can then be grown on top of the metal or metal oxide particles, preferably in the same reaction chamber.

In yet another aspect of the invention, ALD processes are preferably used to deposit metal oxide on the reactive sites on the substrate surface. The metal oxides can then be reduced to metal and carbon nanotubes can then be grown on top of the metal particles, preferably in the same reaction chamber.

In yet another aspect of the invention, methods for forming a roughened surface are provided in which islands of conductive material, such as metal or metal oxide, are formed on the surface using process conditions selected to effect metal particle agglomeration and carbon nanotubes are then grown on top of the metal islands in the same reaction chamber.

In yet another aspect of the invention, carbon nanotubes are grown on a substrate in a process chamber after forming roughened metal surfaces on the substrate at low process temperatures, such as below 650° C.

In yet another aspect of the invention, carbon nanotube growth can be controlled to specify the alignment of the carbon nanotubes, the density of the CNT growth, and the pattern of a CNT network by controlling metal nanoparticle features such as size, shape, and density.

DETAILED DESCRIPTION OF THE PREFERRED EMBODIMENTS

In many applications there are advantages to be gained from the use of roughened metal (e.g., Ru, Ni, Co, Fe) surfaces to initiate carbon nanotube (CNT) growth. However, methods for forming roughened metal thin films and growing CNT in-situ (in the same process chamber as formation of the roughened metal thin films and usually without opening the process chamber and exposing the substrate to the external environment) are lacking in the art. Preferred embodiments of the invention provide methods for forming roughened metal thin films on a substrate and then growing CNT on the substrate in-situ. CNT may be useful in a variety of potential applications in nanoelectronics such as field emission transistor (FET) devices, as a replacement to silicon tips in atomic force microscopy (AFM) probes, gas sensors, detectors, electron conductors in integrated circuits, etc. Nanotubes can also serve as, among other things, components of non-volatile memory devices.

Although referred to as thin films, in some embodiments the roughened metal thin films are not continuous, but rather comprise islands of metal at distinct sites on the surface, while other sites do not contain metal. In other embodiments the roughened metal thin films comprise islands of metal at distinct sites, while other sites on the surface comprise less metal. That is, although metal may be present at all sites on the surface, the thickness of the metal varies across the surface and is greatest at the islands. The metal islands are preferably three-dimensional structures and comprise metal "particles" or "grains." The metal islands serve as nucleation points for CNT growth. Also, some deposition can occur elsewhere on the surface of the substrate when referring to deposition on top of the islands, particles or grains.

The skilled artisan will appreciate that in addition to elemental metal films, other types of roughened films comprising one or more metals can be formed. Thus, in some embodiments elemental metal films are formed, while in other embodiments metal oxide or other compound metal films are formed. As used herein, the term "metal thin film" indicates that the film comprises at least one metal.

The concentration of islands (or particles) is preferably between about 0.001 particles/nm$^2$ to 10 particles/nm$^2$, more preferably between about 0.01 particles/nm$^2$ to 5 particles/ nm², still more preferably between about 0.05 particles/nm to 2 particles/nm², and most preferably between about 0.1 particles/nm² to 1.5 particles/nm².

In some embodiments, the particle concentration is determined, in part, by the initial surface concentration of active sites. As an example, a surface can be treated with a blocking agent (e.g., hexamethyldisilazane) prior to particle deposition as discussed in more detail below. As a result, the number of available sites for reactant bonding is reduced and the particle concentration following deposition may be lower than that obtained for an untreated surface. In some embodiments, depending on the surface termination, the particle concentration could be less than about 0.001 particles/nm².

The spacing between particles, and hence the concentration, also depends in part on the particle size and shape, which in turn is determined by a variety of factors, such as, e.g., the reaction mechanism used to form the particles and the initial surface termination. Examples of particle shapes include, without limitation, laterally wide (or flat), substantially spherical, hemispherical, cubical, cylindrical and triangular.

In some embodiments, roughened surfaces are formed by selectively depositing metal or metal oxide particles on a substrate. Selective deposition can be achieved by modifying a portion of potential reactive sites on the substrate surface to facilitate deposition on some surface sites relative to others. In other embodiments selective deposition is achieved by blocking or inhibiting deposition at particular sites while allowing deposition to occur at other sites.

In other embodiments, roughened surfaces are formed by choosing process conditions, such as temperature, to effect particle agglomeration. For example, a metal oxide thin film, such as a nickel or cobalt oxide thin film, can be reduced in an atmosphere chosen to cause agglomeration. In particular, agglomeration can be caused by reducing metal oxide (e.g., CuO, NiO, CoO) films at elevated temperatures. The substrate surface can also have an effect on the agglomeration process. For example, hydrogen reduction of CuO/NiO forms particles on a $SiO_2$ surface at about 50° C. lower temperature than on a $Al_2O_3$ surface. Further, different surfaces have different mobilities for certain metal atoms and this also has an effect on the agglomeration or particle formation process. Agglomeration typically occurs at temperatures about 50° C. higher than the standard reduction temperature, preferably between about 50° C. and 400° C. higher than the reduction temperature, more preferably between about 100° C. and 250° C. higher. The standard reduction temperature is dependent on time, the material to be reduced and reducing agent. For example, generally, reduction of copper by formic acid occurs at a lower temperature than with ethanol. Standard reduction temperatures generally vary from about 150° C. to 500° C. with organic reducing agents, from about 150° C. to 800° C. with hydrogen, and from about 0 to 500° C. with an excited species, such as hydrogen radicals or hydrogen plasma. Reducing agents that can be employed include, without limitation, alcohols (e.g., ethanol), carboxylic acids, aldehydes, ketones, hydrogen and excited species of a reducing agent (e.g., hydrogen radicals, cations and anions).

In other embodiments, particle agglomeration is achieved by providing a surface material that promotes agglomeration. The surface material may be present on the substrate already or may be deposited prior to forming the roughened metal film. For example, certain metal films, such as noble metal films like Ru, may form particles or rough films on high temperature silicon oxide which does not have many reactive sites. Also, generally Si—H terminated surfaces can produce particles or rough films. A decrease in the number of reactive sites generally causes rough films or particles. In some embodiments, by taking advantage of the selectivity of certain atomic layer deposition (ALD) metal processes, smooth thin films can be formed on one surface, such as planar portions of a surface, while a roughened thin film is grown on a second surface, such as in trenches and vias.

A substrate or workpiece to be processed according to the methods disclosed herein is placed in a reaction space within a reaction chamber. The reaction chamber may be configured for in-situ plasma generation, in which excited species of a particular reactant are formed in the reaction chamber (in-situ). As an alternative, excited species of a particular reactant may be formed at a location external to the reaction chamber and directed to the reaction chamber to contact the substrate.

As used herein, atomic layer deposition (ALD) refers to any vapor deposition process that is based on controlled, self-limiting reaction of precursor chemicals. In an ALD process, gas phase reactions are avoided by contacting a substrate alternately and sequentially with vapor phase reactants. Vapor phase reactants may be separated from each other in the reaction chamber, for example, by removing excess reactants and/or reactant by-products from the reaction chamber between reactant pulses. This purge step may be accomplished with an evacuation step and/or with the aid of an inactive gas pulse. In some embodiments an inactive carrier gas is used to feed the reactants into the reaction chamber and also serves as a purge gas to push excess reactants and/or reaction byproducts out of the reaction chamber.

An ALD cycle preferably comprises alternating and sequential provision (or pulses) of a first and second reactant. Depending on the nature of the film to be formed, additional reactants may be included. The first reactant is conducted into the chamber in the form of vapor phase pulse, optionally with the aid of a carrier gas, and contacted with the surface of the substrate. Conditions are selected such that no more than about one monolayer of the precursor is adsorbed on the substrate surface in a self-limiting manner per cycle. Excess first reactant and reaction byproducts, if any, are purged from the reaction chamber, often with a pulse of inert gas such as nitrogen or argon. In some embodiments this is accomplished by turning off the flow of reactant to an inert carrier gas, while continuing to flow the carrier gas through the chamber.

In the next phase of the ALD cycle, a second gaseous reactant is pulsed into the chamber where it reacts with the first reactant bound to the surface. Again, reactants and conditions are selected such that this step is also self-limiting. Excess second reactant and gaseous by-products of the surface reaction are removed from the reaction chamber, also preferably with the aid of an inert gas.

The steps of pulsing and purging (the ALD cycle) are repeated until a thin film of the desired thickness has been formed on the substrate, with each cycle leaving no more than a molecular monolayer.

Although the above process describes first, second, and third reactive cycles, the reactive cycles may begin with any reactant depending on the particular circumstances, such as ABC, BCA, or CAB.

As mentioned above, each pulse or phase of each ALD cycle is preferably self-limiting. An excess of reactant precursors is supplied in each phase to saturate the susceptible substrate surfaces. Surface saturation ensures reactant occupation of all available reactive sites (subject, for example, to physical size or "steric hindrance" restraints) and thus excellent step coverage.

As mentioned above, roughened metal thin films can be formed by modifying a surface prior to ALD of metal or metal oxide particles. In some embodiments, a surface is modified by providing a surface termination that enhances deposition at particular locations, such as by treating the substrate with a halide or metalorganic reactant. Suitable halide reactants and chemicals include, without limitation $TiCl_4$, $ZrCl_4$, $HfCl_4$, and $SiCl_4$ or any other compound containing at least one halogen atom. Suitable compounds for the halide chemical treatment can also be chosen by the skilled artisan. Noble metals nucleate differently on different surfaces depending on the reactant. For example, $Ru(EtCp)_2$ has quite poor nucleation on silicon oxide surfaces at temperatures around 300° C., producing rough films or particles. However, bis(2,4-dimethylpentadienyl)ruthenium nucleates quite well at 300° C. producing smoother films or particles with lower grain size. In some embodiments, these reactants are preferably used to deposit elemental metals and more preferably noble metals. However, they can also be used to deposit more complex metals such as metal oxides.

In other embodiments, the substrate surface is modified by blocking reactive sites, for example with hexamethyldisilazane (HMDS). These embodiments are preferably used to deposit metal oxide particles, such as alumina or iron oxide, but can also be used to deposit elemental metals. When blocking reagents are used, water is preferably used as an oxygen source in ALD reactions to deposit metals or metal oxides, although other oxygen sources are possible.

By controlling the concentration of a particular surface termination, a roughened surface may be formed by using ALD to deposit metal or metal oxide particles at the available reactive sites. With each successive ALD cycle, the particles grow in size to yield larger particles (e.g., nanoparticles). Surface terminations that facilitate metal deposition by ALD are described in U.S. patent application Ser. No. 11/375,819, filed Mar. 14, 2006, the disclosure of which is incorporated herein by reference in its entirety. Methods for forming roughened surfaces on a substrate are described in U.S. patent application Ser. No. 11/414,510, filed Apr. 28, 2006, the disclosure of which is incorporated by reference in its entirety.

In some embodiments, a roughened metal surface is formed on a substrate by selectively depositing metal by an ALD process at reactive sites that have been modified to facilitate deposition. The substrate surface is preferably treated first with a deposition enhancing agent, preferably a halide or metalorganic compound, to modify a portion of the surface. That is, the surface termination at a portion of possible reactive sites is modified to facilitate metal deposition. In some embodiments, the substrate is treated by a heat treatment to modify the concentration of OH groups on the surface. The surface treatment can include heat treatment, chemical treatment, or a combination of heat treatment and chemical treatment.

The halide or metalorganic compound may be, for example, a metal halide, a hydrogen halide or a metalorganic compound, as described in more detail below. In some embodiments the halide is selected from the group consisting of HCl, $HfCl_4$, $AlCl_3$ and $SiCl_4$. The halide or metalorganic compound can be selected by the skilled artisan based on its ability to react with the surface on which deposition is desired at an appropriate reaction temperature. The concentration is selected to achieve the desired density of modified surface sites and hence the desired density of metal particles in the roughened film. The length of exposure can also have an effect in some cases. Generally, the surface site concentration, e.g. OH group concentration, can be predetermined or defined by choosing the preheating temperature of the substrate material, such as $SiO_2$. Also, the density of the metal particles formed on the substrate can be determined or predicted by choosing a halide or metalorganic compound with a certain known size.

Excess halide or metalorganic compound is removed from the reaction chamber and multiple ALD cycles are carried out to deposit metal, preferably a noble metal, at the modified surface sites. Each cycle comprises pulsing a vaporized metal precursor into the reaction chamber to selectively adsorb on the substrate at the modified locations, purging the reaction chamber to remove excess metal precursor and reaction by-products, if any, providing a pulse of a second reactant, preferably an oxygen-containing reactant (e.g., molecular oxygen, ozone) (also "oxygen-containing precursor" and "oxygen-containing species" herein), ammonia or ammonia plasma containing gas onto the substrate, and purging the reaction chamber to remove excess second reactant and any gaseous by-products formed in the reaction between the metal precursor layer on the first surface of the substrate and the second reactant. The cycle may be repeated a predetermined number of times to achieve a desired surface roughness, which is a function of the size of the particles and their density.

The substrate can comprise various types of materials. When manufacturing integrated circuits (ICs), the substrate typically comprises a number of thin films with varying chemical and physical properties. Preferably, at least one surface comprises a metal, semiconductor or semiconductor oxide or nitride. For example, a surface may comprise silicon, polysilicon, SiGe, Ge, GaAs, silicon oxide (e.g., $SiO_2$) or a silicon nitride, such as silicon oxynitride. The substrate may comprise a high-k dielectric layer, a metal layer, and/or a metal nitride. Further, the substrate surface may have been patterned and may comprise structures such as nodes, vias and trenches.

Figure 1:
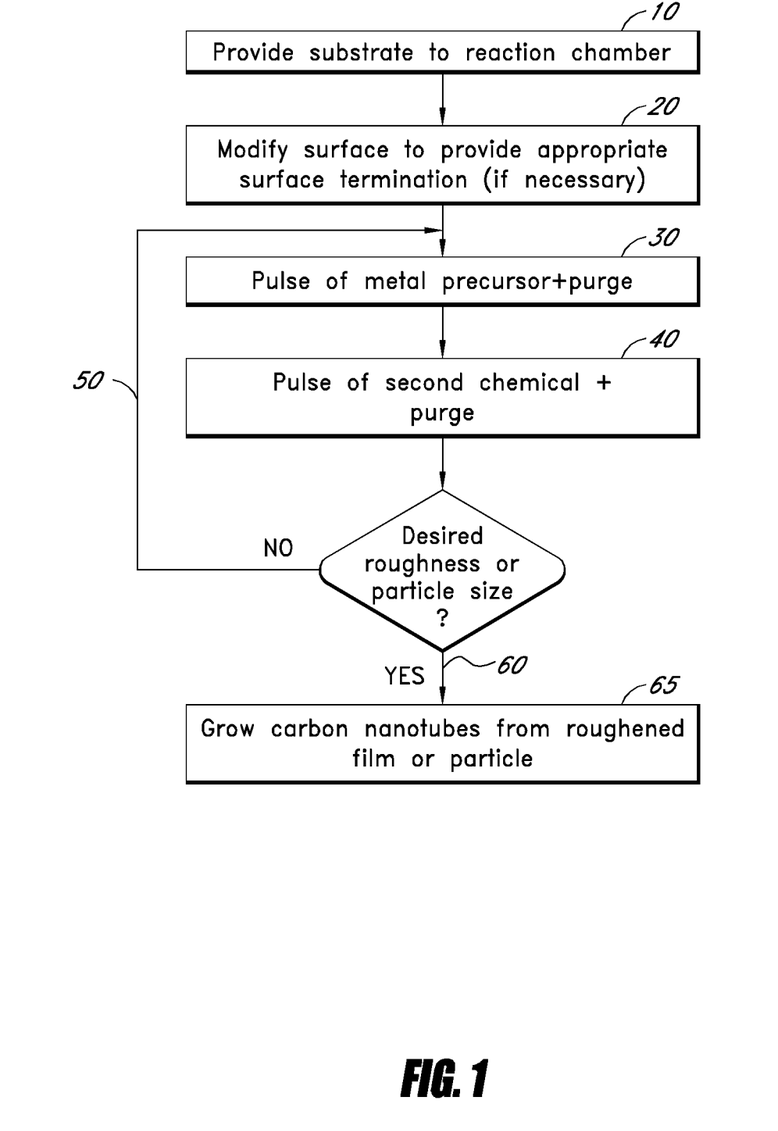
FIGS. 1 and 2 are process flow diagrams for growing carbon nanotubes from a roughened surface, according to several embodiments of the invention.

With reference to FIG. 1, in a first phase 10 a substrate is provided in a reaction chamber configured for ALD and heated to a predetermined deposition temperature, generally at lowered pressure. Deposition temperatures are maintained below a precursor thermal decomposition temperature but at a sufficiently high level to avoid condensation of reactants and to provide the activation energy for the desired surface reactions. Of course, the appropriate temperature window for any given ALD reaction will depend upon the surface termination and reactant species involved. In some embodiments, the substrate comprises an initial surface termination (e.g., OH or $NH_2$ groups).

In a second phase 20, the substrate surface is modified to provide a surface termination that enhances metal deposition. Preferably, the surface termination does not saturate the surface. In a third phase 30, the modified surface is contacted with a metal precursor (metal source chemical) to adsorb the metal at surface sites comprising the modified surface termination. In a fourth phase 40, the surface is contacted with a second reactant, such as an oxygen-containing reactant, to form metal or metal oxide particles at surface sites comprising the modified surface termination. The third and fourth phases may be repeated 50 as desired until a surface with a desired roughness is achieved 60.

In the second phase 20, with the substrate disposed in a reaction chamber (or reaction space), a halide or metalorganic compound is exposed to the substrate surface to produce a desired concentration of modified sites. The concentration of surface termination sites can be chosen as desired by, e.g., selecting an appropriate metal halide or metalorganic compound pulsing time. For example, if the halide compound (or reactant) pulsing time required for saturation coverage is 5 seconds, sub-saturating halide coverage may be achieved by using pulsing times less than 5 seconds. The concentration of the surface termination sites can also be selected by choosing the size of the metal halide or the metalorganic compound. The desired concentration of reactive sites can thus be determined for a particular reactant and reaction conditions by routine experimentation.

Figure 3:
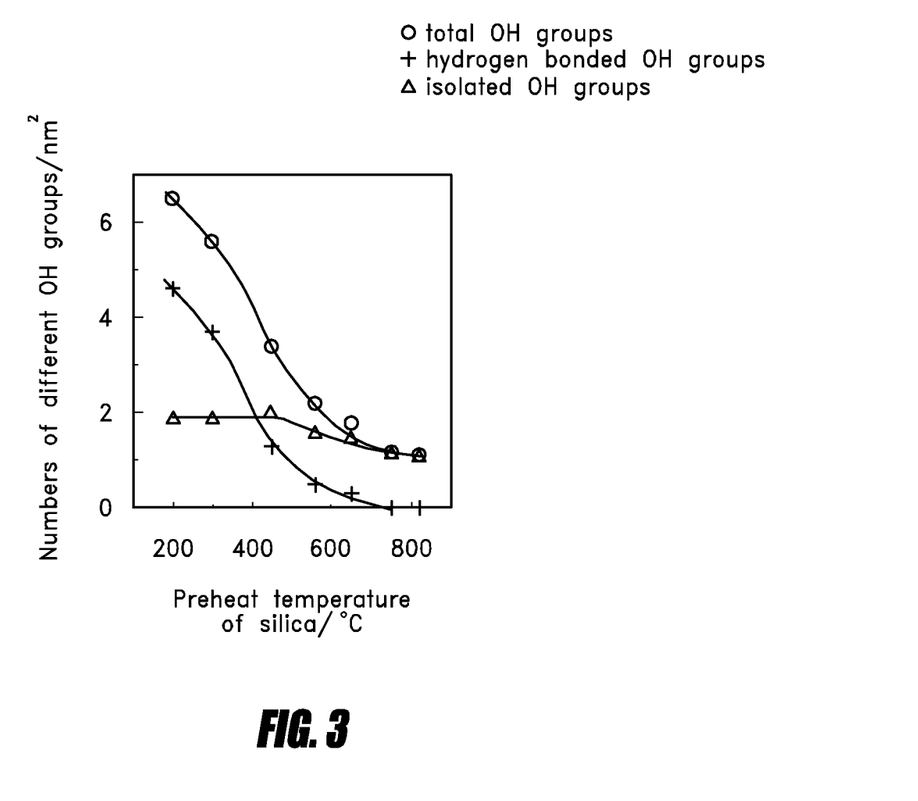
FIG. 3 is a two-dimensional plot showing the concentration of OH groups on a silica surface at various preheating temperatures.

In some embodiments, heat treatment may be used, alone or in combination with the chemical treatment, to effect a desired surface termination concentration as shown in FIG. 3 for $SiO_2$ and discussed in greater detail below. The heat treatment temperature can be selected based on the desired concentration of OH groups on the substrate surface. After heat treatment the OH groups are preferably more reactive with the metal precursor than the other surface locations. In other embodiments, the halide or metalorganic compound chemical treatment can be done after the heat treatment to further enhance deposition. The desired concentration of reactive sites can thus be determined for a particular reactant and reaction conditions by routine experimentation.

After chemical treatment, halide or metalorganic surface terminations are preferably at a concentration between about 0.001 terminations/$nm^2$ to 10 terminations/$nm^2$, preferably between about 0.01 terminations/$nm^2$ to 5 terminations/$nm^2$, more preferably between about 0.05 terminations/$nm^2$ to 2 terminations/$nm^2$, most preferably between about 0.1 terminations/$nm^2$ to 1.5 terminations/$nm^2$.

The metal halide or metalorganic-terminated surface is preferably more reactive with the metal precursor than unterminated surface locations, leading to the preferential formation of discrete islands and the desired roughened thin film. In some embodiments this is achieved by decreased incubation time at modified sites.

The halide or metalorganic compound is not limited in any way. Halides may comprise, for example and without limitation, an element selected from the group consisting of Sc, Ti, V, Fe, Cr, Mn, Zn, B, C, Al, Si, P, Zr, Nb, Mo, In, Ga, Ge, Sn, Hf, Ta and W. The halide may also be a non-metal halide, such as HCl or $PCl_5$. In some embodiments the halide is a chlorine compound and comprises at least one chlorine atom.

If a metalorganic compound is utilized for the surface treatment, it may comprise, for example and without limitation, an element selected from the group consisting of Sc, Ti, V, Fe, Cr, Mn, Zn, B, C, Al, Si, P, Zr, Nb, Mo, In, Ga, Ge, Sn, Hf, Ta and W, and one or more ligands selected from the group consisting of substituted or non-substituted alkyl-, alkylamide-, alkoxide-, amidinate-, aryl-, betadiketonate-, imido-amido- and cyclopentadienyl-compounds. In some embodiments, the metalorganic compounds are selected from the group consisting of trimethylaluminum, tetrakis(ethylmethyl)aminohafnium, tetrakis(dimethyl)aminohafnium, tetrakis(diethyl)aminohafnium, tetrakis(ethylmethyl)aminozirconium, tetrakis(dimethyl)aminozirconium and tetrakis(diethyl)aminozirconium.

The halide or metalorganic treatment is preferably conducted at a treatment temperature such that the halide or metalorganic reactants have sufficient vapor pressure but below the temperature at which they begin to decompose. In preferred embodiments the treatment temperature is between about 0° C. and about 1000° C., more preferably between about 100° C. and about 400° C., and still more preferably between about 150° C. and about 300° C.

The halide or metalorganic treatment may be provided a single time, or may be repeated multiple times until a desired concentration of surface terminations is achieved. For example, alternating pulses of the halide or metalorganic and a metal reactant may be provided. These alternating pulses may be repeated any number of time prior to beginning the regular ALD cycles of metal precursor and second reactant as described below.

With continued reference to FIG. 1, in the third phase 30, a metal precursor is exposed (or pulsed) to the modified surface. As discussed above, the metal precursor is preferably more reactive with portions of the surface modified with metal halide or metalorganic surface terminations prepared in the second phase 20 than with unmodified portions of the surface. The metal precursor reacts in a self-limiting manner.

Gaseous precursors and/or gaseous by-products formed in the reaction are removed from the reaction chamber by evacuating the chamber with a vacuum pump and/or by purging the gas from inside the reactor with the aid of an inert gas such as argon or nitrogen. Typical purging times are from about 0.05 to 20 seconds, more preferably between about 1 and 10, and still more preferably between about 1 and 2 seconds.

In some embodiments, the metal precursor comprises one or more metals selected from the group consisting of Bi, Mg, Ca, Sr, Rb, Cs, Ba, Ni, Mn, Cu, Co, Ti, Ta, Zr, Hf, V, Nb, Cr, W, Mo, Sc, Y, Lu, La, Ce, Pr, Nd, Pm, Sm, Eu, Gd, Tb, Dy, Ho, Er, Tm, Yb, Fe, Zn, Sn, Sb, Cr, In, Cd, Ga, Ge, B, As, Al, Si, Ru, Rh, Pd, Ag, Re, Os, Ir, Pt, Au, Hg, and Pb. Preferably, the metal precursor (and hence the metal particles in the roughened film) comprises one or more metals selected from the group consisting of Cr, Cu, Ni, Fe, Co, Zn, Ru, Rh, Pd, Ag, Re, Os, Ir, Pt, Mo and W. More preferably, the metal particles comprise one or more noble metals. Suitable metal precursors (or source chemicals) may be selected by the skilled artisan. Preferably, metal source chemicals that are different from the halide or metalorganic compound are used.

Preferred metal precursors include cyclopentadienyl and betadiketonate metal compounds, more preferably metallocene compounds, beta-diketonate compounds and acetamidinato compounds. Particularly preferred metal precursors are cyclopentadienyl and acetylacetonate (acac) precursor compounds. In some embodiments a bis(ethylcyclopentadienyl) metal compound is used.

When depositing ruthenium thin films or particles, preferred metal precursors may be selected from the group consisting of bis(cyclopentadienyl)ruthenium, tris(2,2,6,6-tetramethyl-3,5-heptanedionato)ruthenium, 2,4-(dimethylpentadienyl)(ethylcyclopentadienyl)ruthenium, and tris(N,N'-diisopropylacetamidinato)ruthenium(III) and their derivatives, such as bis(N,N'-diisopropylacetamidinato)ruthenium(II) dicarbonyl, bis(ethylcyclopentadienyl)ruthenium, bis(pentamethylcyclopentadienyl)ruthenium and bis(2,2,6,6-tetramethyl-3,5-heptanedionato)(1,5-cyclooctadiene)ruthenium(II). In preferred embodiments, the precursor is bis(ethylcyclopentadienyl)ruthenium (Ru $(EtCp)_2$), bis(2,4-dimethylpentadienyl)ruthenium or (2,4-dimethylpentadienyl)(ethylcyclopentadienyl)ruthenium, When depositing platinum films or particles, preferred metal precursors include (trimethyl)methylcyclopentadienylplatinum, platinum (II) acetylacetonato, bis(2,2,6,6-tetramethyl-3,5-heptanedionato)platinum(II) and their derivatives.

When depositing iridium films or particles, preferred metal precursor include tris(acetylacetonato)iridium(III) and derivates of those.

When depositing palladium films or particles, preferred metal precursors include bis(hexafluoroacetylacetonate)palladium(II).

When depositing nickel-containing films or particles, preferred metal precursors include nickel chloride, bis(acetylacetonate)nickel(II), bis(2,2,6,6-tetramethyl-3,5-heptanedionato)nickel(II) and bis(cyclopentadienyl)nickel(II) and derivates of those.

When depositing cobalt-containing films or particles, preferred metal precursors include bis(acetylacetonate)cobalt(II), bis(2,2,6,6-tetramethyl-3,5-heptanedionato)cobalt(II) and bis(cyclopentadienyl)cobalt(II) and derivates of those.

When depositing cobalt-containing films or particles, preferred metal precursors include bis(acetylacetonate)cobalt(II), bis(2,2,6,6-tetramethyl-3,5-heptanedionato)cobalt(II), tris(acetylacetonate)cobalt(III), tris(2,2,6,6-tetramethyl-3,5-heptanedionato)cobalt(III) and bis(cyclopentadienyl)cobalt(II) and derivates of those.

When depositing copper-containing films or particles, preferred metal precursors include copper chloride, bis(acetylacetonate)copper(II) and bis(2,2,6,6-tetramethyl-3,5-heptanedionato)coppert(II) and derivates of those.

When depositing chromim-containing films or particles, preferred metal precursors include tris(acetylacetonate)chromium(III) and derivates of that.

When depositing iron-containing films or particles, preferred metal precursors include acetylacetonate compounds of iron and ferrocene compounds and derivates of those.

When depositing zinc-containing films or particles, preferred metal precursors include alkylzinc compounds, such as diethylzinc(II).

When depositing tungsten or molybdenum-containing films or particles, preferred metal precursors include metalorganic compounds, such as cyclopentadienyl-, alkylamide- and imido-amido-compounds of tungsten and molybdenum.

The metal precursor may be solid, liquid or gaseous material, provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, for single wafer processing the pulsing time is from about 0.05 to 10 seconds. However, depending on the substrate type and its surface area, the pulsing time may be even higher than 10 seconds, in some cases from about 10 to about 60 seconds or more. For example, for batch reactors pulse times may range from milliseconds to minutes or longer. Preferably, for a 300 mm wafer in a single wafer ALD reactor, the metal precursor is pulsed for from 0.05 to 10 seconds, more preferably for from 0.25 to 3 seconds and most preferably for about 0.5 to 2 seconds.

The mass flow rate of the metal precursor can be determined by the skilled artisan. In one embodiment, for deposition on 300 mm wafers the flow rate of metal precursor is preferably between about 1 and 1000 sccm without limitations, more preferably between about 100 and 500 sccm. The mass flow rate of the metal precursor is usually lower than the mass flow rate of the oxygen precursor, being usually between 10 and 10000 sccm without limitation, more preferably between about 100-2000 sccm and most preferably between 100-1000 sccm.

In the fourth phase 40, the surface is contacted with a second reactant, preferably an oxygen-containing reactant, to form metal or metal oxide particles on the substrate surface. An oxygen-containing reactant may be provided, for example, by pulsing diatomic oxygen gas or a mixture of oxygen and another gas, like ozone, into the reaction chamber.

In other embodiments, oxygen is formed inside the reactor, such as by decomposing oxygen containing chemicals. Oxygen containing chemicals that can be decomposed in the reactor to produce oxygen include, without limitation, $H_2O$, $H_2O_2$, $N_2O$, $NO_2$, $O_3$, and organic peroxides. Mixtures of such chemicals can also be used. In other embodiments, the catalytical formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium. In some embodiments, excited species of an oxygen-containing compound (e.g., oxygen cations, oxygen anions, oxygen radicals) may be used, which can be formed using an in-situ (or direct) or remote plasma (or radical) generator.

An oxygen-containing reactant is preferably selected from the group consisting of molecular oxygen, ozone and excited species of oxygen (e.g., oxygen cations, anions and/or radicals). In a preferred embodiment the oxygen-containing reactant is molecular oxygen. In some embodiments, the oxygen-containing reactant is pure molecular (diatomic) oxygen ($O_2$), but can also be a mixture of oxygen and inactive gas, for example, nitrogen or argon. As an example, the oxygen-containing reactant can be air. Excited species of oxygen may be formed in the reaction space comprising the substrate using an in-situ plasma (or radical) generator, or in a remote plasma generator external to the reaction space comprising the substrate.

The second reactant is preferably pulsed for from about 0.05 to 10 seconds, more preferably for from 1 to 5 seconds, most preferably about for from 2 to 3 seconds. In some embodiments, the second reactant is pulsed from about 10 seconds to about 60 seconds, or even on the order of several minutes in some cases. In batch ALD reactors, reactor volumes can be massive and therefore pulsing or purging of several minutes is not uncommon.

In some embodiments, such as in the deposition of a roughened metal on a high-k layer a thermal ALD process is used.

Gaseous precursors and/or gaseous by-products formed in the reaction between the precursors are removed from the reaction chamber by evacuating the chamber with a vacuum pump and/or by purging the gas from inside the reactor with the aid of an inert gas such as argon or nitrogen. Typical purging times are from about 0.05 to 20 seconds, more preferably between about 1 and 10, and still more preferably between about 1 and 2 seconds. However, it can be from about 10 seconds to about 60 seconds, or even on the order of minutes in some cases, like in batch reactors.

With continued reference to FIG. 1, it will be appreciated that with each successive cycle, metal will be deposited over portions of the surface modified in the second phase 20 and that the third and fourth phases 30 and 40 can be repeated as desired to achieve particles with desired particle size distributions. Thus, the third 30 and fourth 40 phases may be repeated 50 until a substrate comprising a surface of desired roughness is achieved 60. In some embodiments the third 30 and fourth 40 phases may be repeated between 10 and 100 times to achieve a desired surface roughness 60. In other embodiments, the third and fourth phases 30 and 40 are repeated in excess of 100 times, such as 1000 or 2000 times, to achieve a surface with desired roughness.

In some embodiments, the third 30 and fourth 40 phases are repeated until a surface roughness between about 0.5 to 100 nm (RMS roughness) is achieved, preferably between about 1.0 to 50 nm (RMS roughness), more preferably between about 2.0 to 30 nm (RMS roughness). For some applications, like roughened bottom electrodes, ultimate particle sizes are preferably between about 5 nm and 100 nm, more preferably between about 10 nm and 50 nm. For bottom electrodes, the film is preferably continuously electrically conductive, though the film need not be physically continuous. In some cases, electron tunneling may occur, and in some cases the underlying layer may conduct electricity.

After the roughened metal surface is formed with the desired roughness or particle size 60, carbon nanotubes can be grown from the roughened metal surface 65. The carbon nanotubes can be grown in the same process chamber where the metal particles are deposited, including ALD reactors such as the Pulsar® model or Advance® 400 Series models that are commercially available from ASM International N.V. Growing the CNT in-situ is advantageous because the substrate is not exposed to the outside or external environment (for example, air) between formation of the roughened metal particles and the growth of CNT. The carbon nanotubes can also be grown at relatively low temperatures below about 650° C., including about 440° C. to about 650° C. CNT can also grow on the reaction chamber walls, however, these can easily be cleaned with a strong oxidizing agent, such as ozone or oxygen radicals or oxygen plasma.

In alternative embodiments, in the second phase 20 the surface can be modified by blocking surface sites, thereby limiting metal deposition to primarily unblocked surface sites. Preferred blocking agents prevent reaction between blocked surface sites and a metal precursor. The blocking agent is preferably strongly bound to the surface such that displacement by the metal precursor is prevented. In such alternative embodiments the surface selected in the first phase 10 preferably includes a surface termination (e.g., OH groups) that is already reactive with a metal precursor. As an example, the surface may comprise an outermost $SiO_2$ layer comprising OH surface terminations.

A blocking agent, upon exposure to the surface, preferably reacts with and blocks isolated OH groups (or other reactive surface termination sites) on the surface. Preferred blocking agents include, without limitation, hexamethyldisilazane (HMDS) and other silazane group chemicals, and silicon compounds, such as silane group chemicals (e.g., organosilanes). Metal precursors are preferably more reactive with certain types of reactive sites, such as, OH groups than with, e.g., Si—O—Si bridge sites on the $SiO_2$ surface. Thus, in the third phase 30 the metal precursor reacts with the OH terminated portions of the surface and not with blocked portions of the surface. Subsequent exposure to a second reactant, such as an oxygen-containing reactant (e.g., molecular oxygen or $H_2O$), in the fourth phase 40 produces a metal particle at the unblocked sites. Because water does not remove the blocking agent, this method can also be used to form metal oxide particles (e.g., alumina or iron oxide particles) if water is used as the oxidizing agent.

As discussed above, the third and fourth phases 30 and 40 may be repeated as desired to deposit metal or metal oxide particles with a desired size distribution and, hence, a surface of desired roughness. In some embodiments the blocking agent preferably blocks about 50% or more, more preferably about 80% or more of the reactive sites that a particular precursor can subsequently react with. In some cases, if a low particle concentration is desired, the blocking agent can block about 95% or more (in some cases about 99.9% or more) of the reactive sites that a particular precursor can react with. The amount of blocking agent and the exposure time necessary to achieve the desired level of blocking, and hence the desired particle concentration, can be determined for particular circumstances through routine experimentation. Self-assembled monolayers (SAM) can also be used as a blocking agent. The deposited particle concentration and size can be accurately controlled by choosing the right preheating temperature for the substrate and choosing a SAM with a defined size.

In still other embodiments, roughened surfaces are to be formed by choosing process conditions to promote particle agglomeration. Process conditions that can be selected to effect particle agglomeration include, without limitation, substrate temperature during deposition, heat treatment parameters and plasma parameters used to prepare an initial surface termination on the substrate surface prior to metal deposition.

Figure 2:
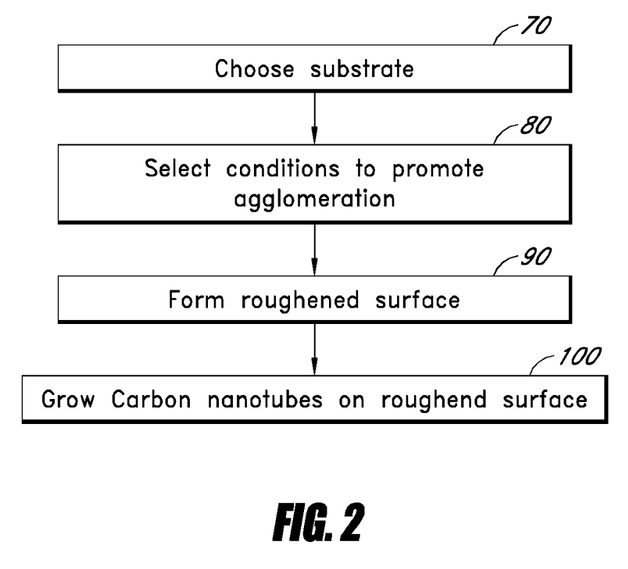

With reference to FIG. 2, a suitable substrate is selected 70 and placed into a reaction space. The substrate may be selected, for example, as described above in the context of FIG. 1. Next, process conditions are selected 80 to effect particle agglomeration. Next, the deposition process is carried out and a roughened surface is formed 90. In one embodiment, the roughened surface is formed by depositing a metal oxide and reducing the metal oxide at a temperature sufficient to cause particle agglomeration. After the roughened surface is formed, carbon nanotubes are grown on the roughened surface 100. In some embodiments, the carbon nanotubes are grown at substrate temperatures close to the agglomeration step, to minimize substrate heating and cooling times. The CNT can be grown in-situ, without exposing the substrate to the external environment or air between loading the substrate, agglomeration 80 and growing CNT 100.

In some embodiments a metal oxide thin film can be formed on a substrate by ALD type processes and caused to agglomerate by reduction to metal. A typical ALD process comprises one or more pulsing cycles, each cycle comprising: pulsing a vaporized metal precursor into the reaction chamber to form at most a molecular monolayer (ML) of the metal precursor on the substrate, purging the reaction chamber to remove excess metal precursor and any reaction by-products, providing a pulse of a second reactant comprising an oxygen-containing reactant onto the substrate, purging the reaction chamber to remove excess second reactant and any gaseous by-products formed in the reaction between the metal precursor layer on the first surface of the substrate and the second reactant, and repeating the pulsing and purging steps until a metal oxide thin film of the desired thickness has been formed. In some embodiments, the oxygen-containing reactant is ozone ($O_3$). Additional description of methods that can be used for depositing metal oxide thin films are described in U.S. patent application Ser. No. 11/182,734 to Hamalainen et al., filed Jul. 15, 2005, the disclosure of which is entirely incorporated herein by reference. In other embodiments metal oxide thin films are deposited by other vapor phase deposition processes, such as CVD or PVD.

Next, the deposited metal oxide thin film is reduced to a metal thin film under conditions selected to effect particle agglomeration, thereby forming a roughened surface over the substrate. In some embodiments, the metal oxide thin film is contacted with a reducing agent preferably selected from the group consisting of alcohols (—OH), aldehydes (—CHO) and carboxylic acids (—COOH). In other embodiments reduction may be achieved using excited species of a reducing agent, such as, e.g., excited species of hydrogen. A description of methods for reducing metal oxide thin films to metal thin films can be found in U.S. Pat. No. 6,921,712 to Soininen et al., filed May 15, 2001, the disclosure of which is entirely incorporated herein by reference.

Reduction without particle agglomeration is typically achieved at a temperature in the range of 250° C. to 400° C., preferably 300° C. to 400° C., and in particular 310° C. to 390° C. In some cases, reduction can be done even below 250°

C. and in other cases, substrate materials permitting, at temperatures up to 500° C. Here, in contrast, in preferred embodiments reduction is performed under conditions that promote metal agglomeration into three-dimensional particles on the substrate surface. Thus, the substrate is preferably reduced at a temperature sufficient to enable the metal particles to migrate on the substrate surface. In some embodiments, this temperature is about 50° C. higher than the standard reduction temperature (as described above), more preferably between about 50° C. and 400° C. higher than the standard reduction temperature, and still more preferably between about 100° C. and 250° C. higher than the standard reduction temperature. Thus, reduction to produce roughened films is preferably carried out at a temperature from about 300° C. to about 800° C., more preferably about 350° C. to 650° C. However, in some cases, depending on the composition of the metal oxide and the reducing agent, agglomeration may occur at a more typical reduction temperature, for example from about 250° C. to 400° C. For example, plasma or radical reduction may form particles or agglomeration at lower temperatures than with purely thermal reducing agents.

Surface roughening can also be effected by selecting a substrate surface material that promotes particle agglomeration and depositing metal particle using the process described above in the context of FIG. 1. In some embodiments, a metallic (or conductive) surface promotes particle agglomeration. In such a case, metal particles that preferentially interact with one another as opposed to a substrate surface will form three-dimensional islands on the surface of the substrate.

Process conditions can also be chosen to provide an initial surface termination that promotes particle agglomeration. In one embodiment, a plasma step is used to treat the surface prior to metal deposition and plasma parameters are selected to produce a surface with a desired concentration of termination sites. Plasma parameters include, without limitation, RF power, RF frequency, plasma pulse time and plasma power on time. In another embodiment, the substrate may be heated (or annealed) to effect a particular surface termination concentration. Heat treatment parameters include, without limitation, substrate temperature and heating time.

In some embodiments, the concentration of initial surface termination sites can be determined by annealing at an appropriate temperature. As an example, FIG. 3 illustrates how the concentration of OH groups ("groups/nm$^2$," as illustrated) on a silica surface is related to the annealing temperature ("Preheat temperature," as illustrated). The circles represent the total number of OH groups while the + represents the number of hydrogen bonded OH groups and the triangle represents the number of isolated OH groups. With increasing annealing temperature, the concentration of OH groups decreases. Thus, the concentration of OH groups (and hence the eventual concentration of islands and therefore surface roughness) can be selected as desired by choosing an appropriate annealing temperature. The annealing temperature can also be chosen with respect to the desired types of OH groups. The concentration of hydrogen bonded OH groups is greater than the concentration of isolated OH groups for preheat temperatures below about 400° C. If a greater number of hydrogen bonded OH groups is desired a heat treatment temperature below 400° C. could be used, such as around 200° C. Above about 400° C. the concentration of isolated OH groups is greater than the concentration of hydrogen bonded OH groups. If a greater number of isolated OH groups is desired a heat treatment temperature above 400° C. could be used, such as around 400° C. or 500° C. FIG. 3 also shows that the number of hydrogen bonded OH groups is more sensitive to higher temperatures than the number of isolated OH groups.

In any case, once the desired concentration of reactive sites has been achieved a roughened surface may be subsequently formed by the deposition methods outlined above. Thus, in one embodiment, the surfaces may be exposed to alternating or sequential pulses of a metal source chemical and an oxygen-containing species to form metal oxide particles, followed by treatment with a reducing agent to form metal particles. In another embodiment, the surfaces may be treated with a halide or metalorganic compound to further enhance deposition, and subsequently processed with alternating and sequential pulses of a metal source chemical and second reactant such as an oxygen-containing reactant to form metal particles.

Suitable metal precursors may be selected by the skilled artisan. In general, metal compounds where the metal is bound or coordinated to oxygen, nitrogen, carbon or a combination thereof are preferred. As described above, in some embodiments the metal precursors are organic compounds. More preferably cyclopentadienyl or betadiketonate compounds are used. In some embodiments, $X(acac)_m$ or $X(thd)_n$ compounds are used, where X is a metal, m and n are generally, but not necessarily between 2 and 3 and thd is 2,2,6,6-tetramethyl-3,5-heptanedionato.

Oxygen sources are also described above and may be, for example, an oxygen-containing gas pulse and can be a mixture of oxygen and inactive gas, such as nitrogen or argon. In some embodiments the oxygen source may be a molecular oxygen-containing gas pulse. Sources of oxygen include air and a gas mixture with a higher concentration of oxygen than air. In preferred embodiments the oxygen source comprises an activated or excited oxygen species. In some embodiments the oxygen source comprises ozone. The oxygen source may be pure ozone or a mixture of ozone and another gas, for example an inactive gas such as nitrogen or argon. In other embodiments the oxygen source is oxygen plasma. In yet other embodiments, the oxygen source is water.

The ALD methods disclosed herein can be performed in any reactor, reaction chamber or reaction space configured for ALD. Examples of suitable reactors that may be used for the deposition of metals according to the processes of the present invention include commercially available ALD equipment, such as the F-120® reactor, Pulsars reactor and Advance® 400 Series reactor, available from ASM America, Inc of Phoenix, Ariz. and ASM Europe B.V., Almere, Netherlands. In addition to these ALD reactors, many other kinds of reactors capable of ALD growth can be employed, including CVD reactors, Epitaxial reactors, and furnace reactors equipped with appropriate equipment and means for pulsing the precursors. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and U.S. Pat. No. 7,105,054, filed Apr. 16, 2001, which is incorporated herein by reference.

Reaction chambers are preferably kept under vacuum. The pressure in the reaction chamber is typically between about 0.01 and 20 mbar, more preferably between about 1 and 10 mbar.

The deposition processes can optionally be carried out in a reactor or reaction space connected to a cluster tool. Because each reaction space is dedicated to one type of process in a cluster tool, the temperature of the reaction space in each module can be kept constant. This can improve the throughput compared to a reactor in which the substrate is heated up to the process temperature before each run. In addition, pump time is saved if the transfer area behind a load lock is maintained at a low base pressure. In some embodiments, roughened films can be formed in one chamber of the cluster tool and CNT formed in another chamber in the cluster tool while preventing the substrate from being exposed to the environment outside of the cluster tool between depositions.

Although generally described herein in relation to ALD processes, the skilled artisan will recognize that the surface modification can be utilized to selectively deposit metals in other deposition processes, such as chemical vapor deposition (CVD) processes. In addition to enhancing nucleation, surface treatment can allow lower deposition temperatures. As in the ALD reactions described in detail herein, surface treatment, such as halide treatment for CVD, would include the provision of a halide or metalorganic reactant to the reaction space prior to the regular CVD process.

Growing Carbon Nanotubes In-Situ

Previously carbon nanotubes (CNT) were grown at high temperatures above 650° C. using precursors, such as methane. Typically, growth of CNT requires some initiation or catalyst point for the CNT growth to begin. Metal nanoparticles or nanocrystals (for example, Ni, Fe, etc.) can provide the initiation or nucleation necessary to initiate CNT growth. Previous methods for forming metal nanoparticles from decomposing metal-organic compounds result in large rough particles, which do not result in predictable CNT formation.

The skilled artisan will appreciate that there are many different methods for growing CNT, including decomposing a carbon containing compound on the metal nanoparticle or nanocrystal sites of the substrate. Typically, a carbon-containing compound, such as: methane, acetylene ($C_2H_2$), propylene, ethanol, etc. is introduced to the reaction space along with a carrier gas, such as: hydrogen, nitrogen, etc. Other hydrocarbons, such as heavier hydrocarbons like oils, can also be used. Typically, the carbon-containing compound disproportionates or decomposes at the catalytic site and the elemental carbon is incorporated into the structure of the CNT.

Other methods include, using carbon monoxide (CO) as a carbon-containing compound along with a catalytic site, such as the metal islands or roughened thin films described herein. Carrier gases such as hydrogen and nitrogen can be introduced into the reaction space along with the carbon monoxide. Water vapor and carbon dioxide can also be added to the reaction space to lower the CNT growth temperature and facilitate CNT growth. The catalytic sites for CNT growth can comprise Fe, Ni, Co or other metals, such as a noble metal, like Ru. The CNT precursor is preferably CO or other precursor that allows relatively low CNT deposition temperature. CNT deposition temperatures are generally less than 900° C., preferably less than 800° C., more preferably less than 650° C. and most preferably under 550° C. In some case the CNT deposition temperature can be as low as about 400° C. to about 500° C.

Figure 4:
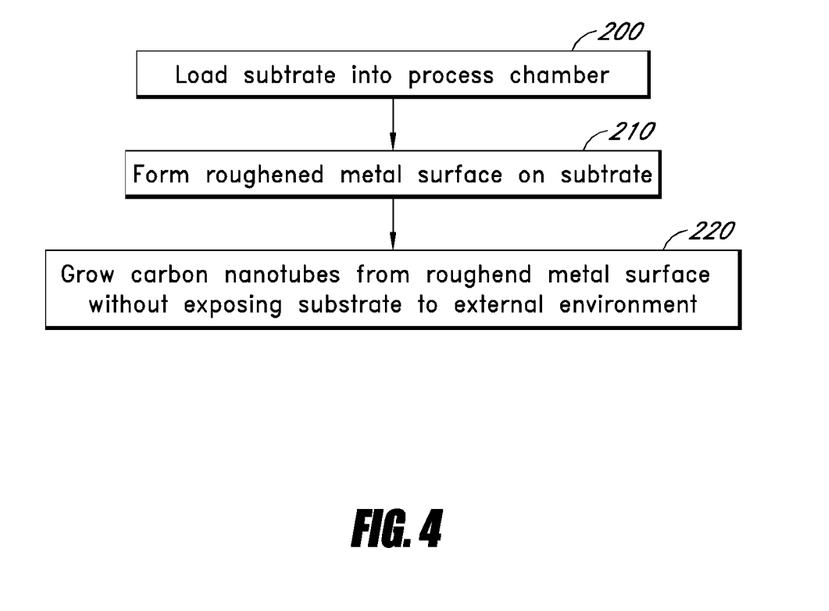
FIG. 4 is a process flow diagram for growing carbon nanotubes from nanoparticles, according to embodiments of the invention.

FIG. 4 illustrates a schematic overview of CNT formation. A substrate is loaded into a process chamber 200. Next, roughened metal surfaces are formed on the surface of the substrate 210. Carbon nanotubes are then grown in-situ from the roughened metal surfaces 220 without exposing the substrate to air. The lack of air exposure to the substrate reduces chances for contamination of the substrate. The ability to grow the CNT in a process chamber cuts down on the substrate process time and eliminates the possible oxidation of oxidation sensitive metal surfaces or particles from air exposure.

Figure 5:
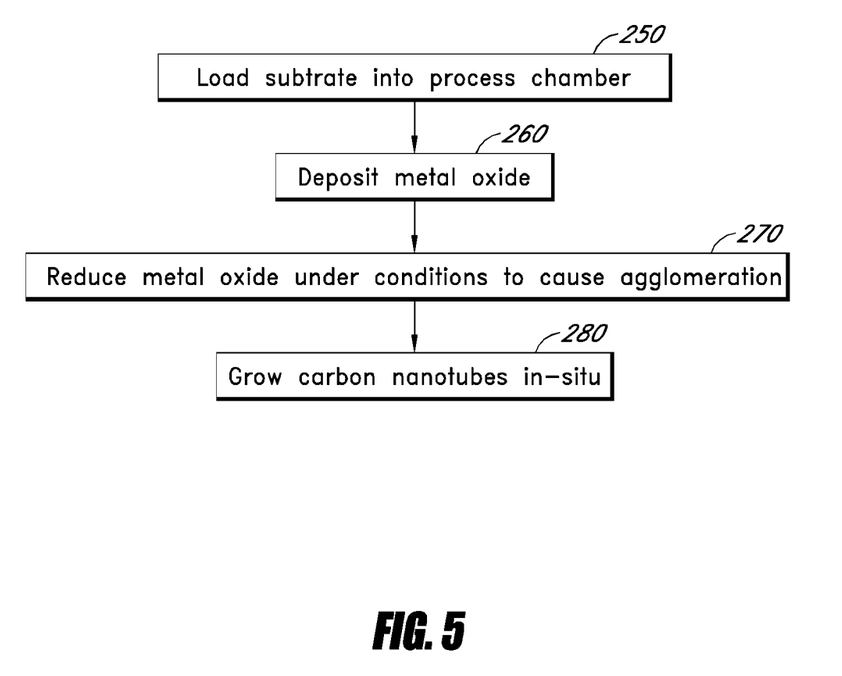
FIG. 5 is a process flow diagram for growing carbon nanotubes from nanoparticles, according to embodiments of the invention.

FIG. 5 illustrates a schematic overview of CNT formation. A substrate is loaded into a process chamber 250. Metal oxide is then deposited on the surface of the substrate 260. Next, the metal oxide is reduced under conditions to cause agglomeration 270. Carbon nanotubes are then grown in-situ 280 from the metal particles. The lack of air exposure to the substrate reduces chances for contamination of the substrate. The ability to grow the CNT in a process chamber cuts down on the substrate process time.

As disclosed herein, small metal nanoparticles can be controllably formed by any of a variety of methods including, using ALD in a process chamber (such as a Pulsar® ALD reactor). The metal nanoparticle size, shape, and density can be manipulated by controlling the surface sites and process formation conditions. The CNT growth off of these metal particles is more predictable and consistent then CNT growth from the metal particles formed from decomposing metal-organic compounds on the substrate surface. As a result, the CNT growth can be controlled based on the properties of the metal nanoparticles that initiate the CNT growth. For example, the particle size may have a proportional effect to the CNT size The CNT can be grown in desired directions (e.g. perpendicular to the plane of the substrate). This and other aspects of CNT growth and resulting network of CNT including the density of the CNT network, the distribution of CNT in the network, the size/length of CNT, etc. can be controlled by modifying the metal nanoparticle characteristics. The CNT growth and resulting network of CNT can be controlled such that the carbon nanotubes are evenly distributed with a relatively constant density across the substrate. Even distribution of the CNT can also include, without limitation: consistent CNT growth coverage on a substrate surface, consistent CNT length, relatively constant CNT distribution per surface area of catalytic sites, etc. The CNT density, distribution, and ordering can be observed using techniques commonly known in the art, such as transmission electron microscopy (TEM) or scanning electron microscopy (SEM).

Depositing CNT in an ordered manner can include, without limitation: growing multiple CNT oriented in a particular direction (e.g. perpendicular to the plane of the substrate), growing multiple CNT of a desired length, growing multiple CNT of multiple desired lengths, etc. Preferably, the CNT can be oriented such that they are perpendicular to the plane of the substrate or parallel/horizontal to the substrate. A network of CNT can also be grown on a surface that has relatively high density of nanoparticles. In some embodiments, the direction of growth of the carbon nanotubes can be controlled by controlling the size and density of metal particles deposited on the substrate.

CNT can also be grown at temperatures below 650° C. In some embodiments CNT can be grown at temperatures of around 440° C. to 650° C. The lower growth temperature permits growing the CNT in-situ in an ALD reactor or other process chamber, like a CVD, Epi, or furnace reactor. In-situ growth offers many benefits over forming the metal nanoparticles and growing the CNT in different process chambers. By avoiding moving the substrate between process chambers, exposure to air, which can contaminate the substrate by forming oxides on the surface of the substrate, and other contaminants is reduced or avoided entirely. Any contamination from oxide formation or other contaminants requires additional cleaning steps before additional processing of the substrate can be performed. Some cleaning steps require hot temperatures that can be detrimental to substrates that contain temperature sensitive components or structures. As a result, it is advantageous to form the metal nanoparticles and grow the CNT in the same reactor without exposure to air. This allows for a faster and more efficient process that can form more complicated structures on the substrate.

In-situ metal nanoparticle formation and CNT growth may facilitate formation of more complicated wafer structures such as transistors formed over the CNT. The elimination of high temperature cleaning steps and introduction of impurities can permit formation of other complicated structures on top of CNT. Controlling the growth of the CNT on the substrate can also permit formation of CNT networks with more predictable qualities.

One of skill in the art will appreciate that other reactor types can also be used to deposit the metal nanoparticles and subsequently grow the CNT from the metal nanoparticles, including without limitation: Epitaxial reactors, batch ALD reactors, CVD reactors, and furnace reactors.

Example 1

Substrates comprising thermal oxide, native oxide and alumina surfaces (OH terminated surfaces) were exposed to $TiCl_4$, thereby forming chlorine-terminated surfaces. The substrates were exposed to a metal source chemical in an ALD process to form metal thin films comprising multiple distinct particles. Each of the thin films had different film properties (e.g., particle sizes) due to different hydroxyl-group (active surface site) concentrations. Since a halide chemical, like $TiCl_4$, can chemisorb on hydroxyl groups, a different concentration of halide termination sites was formed on each of the surfaces, which in turn produced thin films with different film properties. CNTs can then be grown from the thin films at around 600° C. using CO as a precursor and $CO_2$ and $H_2O$ as additives. Flow of the process gases is stopped after the CNTs reach the desired length or configuration.

Example 2

A roughened surface comprising discrete particles of uniform size, such nanocatalyst particles, is formed by ALD. Most metal compounds can utilize only the Si—OH groups on the $SiO_2$ surface, not the Si—O—Si bridges. Thus, the concentration of Si—OH groups on the surface of a chemical oxide (e.g., $SiO_2$ formed on the surface of a silicon wafer by heat treatment in the presence of water) is controlled to provide the desired density of Si—OH reactive sites. The surface is then exposed to a metal source chemical and second reactant in an ALD cycle. Because a substantial portion of the $SiO_2$ surface is covered by Si—O—Si groups, a non-uniform distribution of metal or metal oxide particles on the surface is produced. CNTs can then be grown from the thin films at a substrate temperature around 600° C. using CO as a precursor and $CO_2$ and $H_2O$ as additives. Flow of the process gases is stopped after the CNTs reach the desired length or configuration.

Example 3

An $SiO_2$ surface is formed on a silicon wafer by heat treating the silicon wafer in the presence of water. This surface is then heat treated to 200° C. to produce strongly H-bonded and isolated Si—OH groups on the surface. The $SiO_2$ surface is subsequently exposed to HMDS (hexamethyldisilazane) to selectively block (or remove) isolated OH groups, forming O—Si(CH$_3$)$_3$ upon reaction. Next, the silylated (—O—Si(CH$_3$)$_3$) surface is exposed to a metal source chemical, which reacts with unblocked (or unsilylated) portions of the surface. The surface is subsequently contacted with water to form a metal oxide thin film on unblocked portions of the surface. Since water cannot remove the hydrophobic silylated species from the surface, this process can be repeated to selectively deposit metal oxide (or metal) nanoparticles on the surface. CNTs can then be grown from the nanoparticles at substrate temperatures around 600° C. using CO as a precursor and $CO_2$ and $H_2O$ as additives. Flow of the process gases is stopped after the CNTs reach the desired length or configuration.

Example 4

Figure 6:
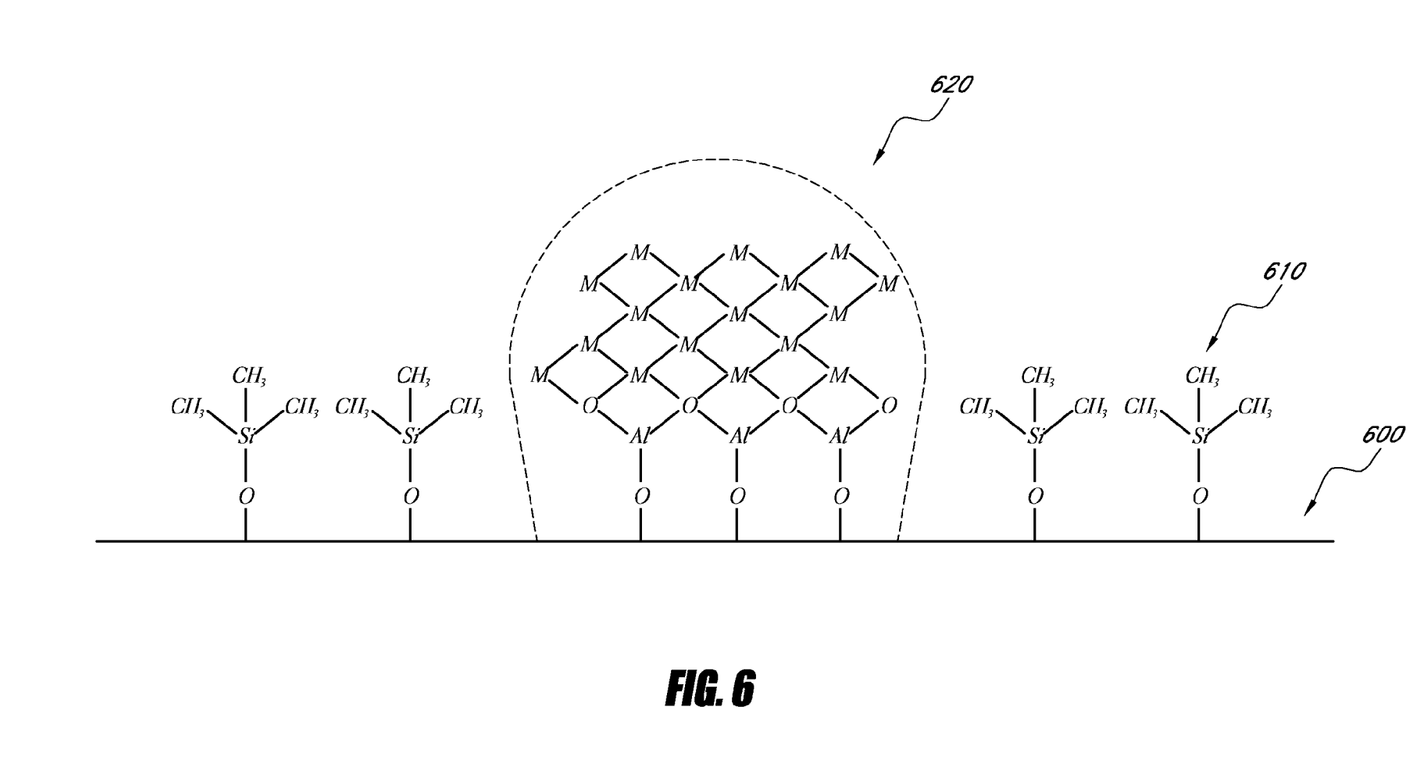
FIG. 6 is a conceptual drawing of a catalytic metal nanoparticle in accordance with embodiments of the invention.

FIG. 6 is a conceptual sketch of a catalytical metal nanoparticle formed in this example. A $SiO_2$ surface 600 is heat treated to remove most of the H-bonded OH groups from the surface, leaving only isolated Si—OH groups. The heat treatment temperature is preferably 400° C. or higher. The surface is exposed to HMDS to block the Si—OH groups and to form the hydrophobic silylated surface (—O—Si(CH$_3$)$_3$) 610. Next, the surface is exposed to Al(CH$_3$)$_3$, which reacts with the Si—O—Si surface sites to form Si—O—Al(CH$_3$)$_2$ and Si—CH$_3$ surface species. The Si—O—Al(CH$_3$)$_2$ surface is then treated with water to form Al—OH sites that can serve as active sites for other metal compounds. Water is preferably used as a second reactant. For example, catalytic metal nanoparticles 620 can be formed on the surface by ALD growth with the water or molecular oxygen $O_2$ as the non-metal compound. The M in the catalytic nanoparticle 620 represents a suitable metal. Note that most of the $SiO_2$ surface is covered by Si—O—Si groups. By this process almost the entire $SiO_2$ surface can be utilized. CNTs can then be grown from the nanoparticles 620 at substrate temperatures around 600° C. using CO as a precursor and $CO_2$ and $H_2O$ as additives. Flow of the process gases is stopped after the CNTs reach the desired length or configuration.

It will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. A method for growing carbon nanotubes on a substrate in a reaction space, comprising:
   forming an initial surface termination on a surface of the substrate;
   forming discontinuous metal particles at distinct sites on the surface by atomic layer deposition; and
   depositing carbon nanotubes on to said metal particles in-situ.

2. The method of claim 1, wherein depositing said carbon nanotubes comprises contacting the substrate with CO.

3. The method of claim 1, wherein said metal particles comprise metal oxide.

4. The method of claim 1, wherein the temperature of the substrate is about the same when depositing said carbon nanotubes and forming said metal particles.

5. The method of claim 1, wherein the substrate is at a temperature less than about 650° C. when depositing said carbon nanotubes.

6. The method of claim 1, wherein depositing is carried out at a substrate temperature of about 440° C. to about 650° C.

7. The method of claim 1, wherein said reaction space is part of an ALD, CVD, Epitaxial, or furnace reactor.

8. The method of claim 1, wherein the initial surface termination is formed on a surface comprising silicon.

9. The method of claim 1, wherein evenly distributed carbon nanotube networks are deposited on said metal particles.

10. The method of claim 1, wherein depositing said carbon nanotubes comprises depositing a carbon nanotube network in an ordered manner.

11. The method of claim 1, wherein the direction of growth of said carbon nanotubes is controlled by controlling the size and density of said metal particles.

12. The method of claim 1, wherein forming an initial surface termination comprises heating the substrate to a temperature above about 200° C.

13. The method of claim 12, wherein forming an initial surface termination further comprises treating said substrate with a halide chemical.

14. The method of claim 1, wherein forming an initial surface termination comprises heating the substrate to a temperature above about 400° C.

15. The method of claim 1, wherein forming an initial surface termination comprises treating said substrate with a halide chemical.

16. The method of claim 1, wherein forming said metal particles on the surface by atomic layer deposition comprises alternately and sequentially providing a noble metal precursor and oxygen precursor.

17. A method for growing carbon nanotubes, comprising:
    providing a substrate in a reaction space;
    modifying the surface of the substrate to produce discrete reactive sites;
    depositing metal particles at the reactive sites using alternating and sequential pulses of a first metal source chemical and a second non-metal species; and
    subsequently depositing carbon nanotubes on to said metal particles, wherein the substrate is not exposed to air between depositing metal particles and depositing carbon nanotubes.

18. The method of claim 17, wherein said metal particles comprise metal oxide.

19. The method of claim 17, wherein depositing said metal particles and depositing said carbon nanotubes are performed in the same reaction chamber.

20. The method of claim 17, wherein depositing said metal particles and depositing said carbon nanotubes are performed in the same cluster tool.

21. The method of claim 17, wherein modifying said surface of said substrate, depositing said metal particles, and depositing said carbon nanotubes are performed at approximately the same temperature.

22. The method of claim 17, wherein deposition of said carbon nanotubes is performed at about 440° C. to about 650° C.

23. The method of claim 17, wherein the modified surface comprises silicon.

24. The method of claim 17, wherein modifying the surface comprises heating the substrate to a temperature above about 200° C.

25. The method of claim 17, wherein modifying the surface comprises treating said substrate with a halide chemical.

26. The method of claim 17, wherein depositing said metal particles on the surface comprises alternately and sequentially providing a noble metal precursor and oxygen precursor.

27. The method of claim 17, further comprising depositing a layer of material on the substrate after depositing said carbon nanotubes.

28. A method for forming carbon nanotubes on a substrate in a reaction space, comprising:
    depositing catalyst nanoparticles on said substrate; and
    depositing carbon nanotubes on said substrate in-situ.

29. The method of claim 28, further comprising depositing a film on the substrate in the same reaction space prior to depositing catalyst nanoparticles.

30. The method of claim 28, wherein the catalyst nanoparticles are deposited by alternately and sequentially providing a noble metal precursor and oxygen precursor.

31. The method of claim 28, wherein the carbon nanotubes are deposited by contacting the substrate with CO.

32. The method of claim 29, further comprising performing a chemical treatment after depositing said film on said substrate and before depositing said catalyst nanoparticles.

33. The method of claim 32, wherein performing said chemical treatment comprises providing a halide chemical.

34. The method of claim 29, further comprising a heat treatment after depositing said film and before depositing said catalyst nanoparticles.

35. The method of claim 34, wherein performing said heat treatment comprises heating the substrate to a temperature above about 200° C.

* * * * *